United States Patent
Micheloni et al.

(10) Patent No.: US 6,822,905 B2
(45) Date of Patent: Nov. 23, 2004

(54) REGULATION METHOD FOR THE SOURCE TERMINAL VOLTAGE IN A NON-VOLATILE MEMORY CELL DURING A PROGRAM PHASE AND CORRESPONDING PROGRAM CIRCUIT

(75) Inventors: Rino Micheloni, Turate (IT); Ilaria Motta, Cassolnovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/331,106

(22) Filed: Dec. 27, 2002

(65) Prior Publication Data

US 2003/0142547 A1 Jul. 31, 2003

(30) Foreign Application Priority Data

Dec. 28, 2001 (EP) .............................................. 01830833
Aug. 30, 2002 (EP) .............................................. 02019433

(51) Int. Cl.$^7$ .............................................. G11C 16/06
(52) U.S. Cl. .............................. 365/185.21; 365/185.12; 365/189.07
(58) Field of Search ......................... 365/185.21, 185.2, 365/189.07, 189.09, 185.12, 185.22

(56) References Cited

U.S. PATENT DOCUMENTS

| | | | | |
|---|---|---|---|---|
| 4,802,138 A | * | 1/1989 | Shimamune | 365/185.21 |
| 5,293,333 A | * | 3/1994 | Hashimoto | 365/185.21 |
| 5,353,252 A | * | 10/1994 | Hashimoto | 365/189.09 |
| 5,943,266 A | * | 8/1999 | Ogura et al. | 365/185.28 |

* cited by examiner

*Primary Examiner*—Gene N. Audong
(74) *Attorney, Agent, or Firm*—Allen, Dyer, Doppelt, Milbrath & Gilchrist, P.A.; Lisa K. Jorgenson

(57) ABSTRACT

A method and a circuit are for regulating the source terminal voltage of a non-volatile memory cell during the cell programming and/or reading phases. The method includes a phase of locally regulating the voltage value and includes comparing the source current of the cell array with a reference current. A fraction of the source current is converted to a voltage and compared with a voltage generated from a memory cell acting as a reference and being programmed to the distribution with the highest current levels. The comparison may be used for controlling a current generator to inject, into the source terminal, the current necessary to keep the predetermined voltage thereof at a constant value.

15 Claims, 9 Drawing Sheets

REGULATION METHOD FOR THE SOURCE TERMINAL VOLTAGE IN A NON-VOLATILE MEMORY CELL DURING A PROGRAM PHASE AND CORRESPONDING PROGRAM CIRCUIT

FIELD OF THE INVENTION

The present invention relates to a method for locally regulating the source terminal voltage in a non-volatile memory cell during the cell programming and/or reading phases. More particularly, the invention relates to a method for locally regulating the source terminal voltage in a non-volatile memory cell during the cell programming and/or reading phases, wherein the voltage is applied by a program-load circuit connected in a conduction path used for transferring a predetermined voltage value to at least one terminal of the memory cell. The invention further relates to a program-load circuit which is incorporated in an electronic semiconductor-integrated memory device comprising an array of non-volatile memory cells, with each of the cells including at least one floating gate transistor having source, drain, gate, and body terminals, and each program-load circuit being connected in a conduction path used for transferring a predetermined voltage value to a terminal of the memory cell.

BACKGROUND OF THE INVENTION

As it is well known in this field of application, a pressing demand for high-density non-volatile memory semiconductors, e.g. flash EEPROMs, from a world-wide semiconductor market has lead to the study and the application of the so-called multi-level memory devices, wherein each memory cell can store more than one bit. Each bit is associated with a predetermined logic level, and the logic levels can be recognized by memory cells having several threshold voltages.

The skilled persons in the art will appreciate that an increased number of threshold voltage levels places stricter demands on the operations to be carried out on the cells, viz. the cell erasing, programming, and reading operations. Reliability considerations place the assigned range reserved for the $2^n-1$ distributions (all of them except for the most programmed one) of a multi-level non-volatile memory cell having n bits/cell at less than 4.5–5V. Consequently, both the width of the threshold distributions and their separation margins become smaller. FIG. 1 of the accompanying drawings is a comparative plot of the threshold voltage distribution in a conventional two-level (two bits per cell) memory cell and in a multi-level memory with three bits per cell.

As a result, a series of phenomena are faced during the fabrication of multi-level memory devices that would be of trivial import for conventional two-level memories. To make the aspects of this invention more clearly understood, the phases for programming multi-level flash memories will be reviewed here below.

A flash cell read operation includes varying the threshold voltage of the cell by a desired amount. This is achieved by a build-up of electrons in the floating gate region. Shown in FIG. 2 are some straight lines that represent the characteristic relation of the voltage applied to the gate terminal of a memory cell with the threshold skip that results from varying the voltages applied to the drain terminal of the cell.

To program the cell and obtain threshold voltage distributions with sufficient precision to yield the multi-level feature, the voltage applied to the control gate terminal may be varied stepwise from a minimum to a maximum value. Under optimum gate terminal conditions, the width of each voltage step is equal to the threshold skip sought.

The use of a stepwise gate voltage brings about a timing problem, if the program operation is to be completed in an effective manner. A large number of cells should be programmed in parallel, to minimize program time. Parallel programming is implemented by an algorithm, called "program & verify", in the course of whose execution each program pulse is followed by a step of reading the cells being programmed to check if they did or did not attain the threshold value.

Any programming pulses will be delivered to properly programmed cells, while cells that have not reached a desired threshold yet will be re-programmed using the same algorithm. Program-load circuits are used for this purpose that allow predetermined program voltage values to be selectively applied to the drain terminals of cells to be programmed. At the same time, the voltage to be applied to the source terminal should be accurately controlled during both the programming and the reading step.

It has been common practice to connect the cell sources to ground during the programming and reading phases by using a predetermined number of pass transistors, usually of the n-channel type. FIG. 3 shows an array sector 11 having four pass transistors 16 placed at each sector apex and individually driven by a SRCCON signal.

The reason for having a ground connection established through pass transistors is that the cell source terminals, to which a varying positive voltage can be applied during the erasing phase, should not be constantly left connected to ground. During the programming phase, the value of the source voltage undergoes modulation due to the parasitic resistances of the lines and the pass transistors through which the source is taken to ground, as do the voltages to the drain and body terminals of the memory cells. This results in the effectiveness of the pulses that vary with the number of cells to be programmed. In addition, the source voltage thus modulated has a drawback in that it affects the drain-source $V_{DS}$ and body-source $V_{BS}$ voltage drops, and especially the gate-source $V_{GS}$ voltage drop with attendant overdrive.

The effects of source voltage modulation also occur during the verifying and reading operations. The outcome of a modulated source voltage is illustrated by the graph of FIG. 4 showing a sequence of voltage-current characteristics of a generic array cell. Characteristic (1) will be considered first. For the cells to be regarded as erased, they must have a larger current than the one of the reference EV (erase verify) as to their gates is applied a voltage $V_{READ}$. Under this condition, a large current is injected through the source terminal S, resulting in the characteristic portion for the largest currents taking a bend. Since the condition to be verified is a current, it can only be met by keeping the cell threshold voltages slightly below those of the cell EV. Characteristic (1) is that of a generic cell, such as i-th cell.

As to characteristic (2), let us assume that the write buffer containing the i-th cell is to be programmed with a pattern where all the cells are at the distribution with less current (i.e. a "00" distribution, past the reference cell PV3), with the exception of the i-th cell which is programmed for the second distribution ("10" distribution, past the reference cell PV1). Since during the programming step the cells progress approximately at the same rate, characteristic (2) for the i-th cell can be taken to be similar to that of the other cells. Here again the characteristic shows a bend due to the injection through the source terminal still being quite high, although lower if compared to the first characteristic. The i-th cell is verified to have been programmed at the desired distribution, and is then disconnected from its program-load circuit, whereas the other cells keep receiving pulses until the desired threshold is reached.

As regards characteristic (3), all the cells have attained their desired distributions and are read. The injection through the source terminal will be quite moderate because the thresholds of all the cells but the i-th lie above the read voltage. Therefore, the characteristic of the i-th cell will no longer show a bend in the large-current range. Thus, if no additional margin has been considered for source voltage modulation, the sense amplifier may erroneously read (or verify) the i-th cell.

The above is just a simple qualitative example of how heavily the modulation of the source voltage may be felt, and of how the method of this invention can make this modulation a constant one for each cell, irrespective of the charge state of the other cells with which it is read or verified, especially if the target is a multi-level cell array having more than two bits per cell.

SUMMARY OF THE INVENTION

An object of the invention is to provide a method for regulating the voltage applied to the source terminal of a non-volatile and multi-level memory cell during the programming and/or reading phases, which method has adequate functional features such as to significantly reduce the effects of the voltage modulations due to parasitic resistances at the connections between the supply voltage sources and the circuit portions which are to receive such a supply.

The invention causes a local regulation of the source voltage by comparing the current Is that flows through the source S of the array cells with a suitable reference current Iref. If the current Is that flows through the source terminal S is smaller than the reference current Iref, a suitable driven current generator will inject current into the source terminal S until the array current values equal the reference current ones.

This and other objects of the invention are provided by a method for regulating a source terminal voltage in a non-volatile memory cell during a cell programming or reading phase. The method may include comparing a source current of the cell array with a reference current, converting a fraction of the source current to a converted voltage, generating a comparison result by comparing the converted voltage with a voltage generated from a memory cell acting as a reference and being programmed to a distribution with the highest current levels, and using the comparison result for controlling a current generator to inject into the source terminal a current to regulate the source terminal voltage.

Another aspect of the invention relates to a circuit for regulating a source voltage in a memory device comprising an array of non-volatile memory cells divided into sectors, with each cell including at least one floating gate transistor having source, drain, gate, and body terminals. The circuit may include a comparator having first and second comparator inputs, and a comparator output. A first circuit branch may be connected to the first comparator input and may be operative to generate an array voltage being proportional to at least a fraction of a current flowing through the source terminal. A second circuit branch may be connected to the second comparator input and be operative to generate a reference voltage being proportional to a current generated by an erased cell. In addition the circuit may include a current generator controlled by the comparator output to stabilize the source voltage.

Yet another aspect of the invention is directed to a multi-level memory device of a flash EEPROM type comprising an array of non-volatile memory cells divided into sectors, with each cell including at least one floating gate transistor having source, drain, gate, and body terminals; and a set of n source pass transistors connected between nodes of each sector and corresponding voltage references, with n being based upon a number of array cells to be programmed.

BRIEF DESCRIPTION OF THE DRAWINGS

The features and advantages of the method and the circuit according to the invention should become apparent from the following description of embodiments thereof, given by way of example and not of limitation with reference to the accompanying drawings.

DETAILED DESCRIPTION OF THE PREFERRED EMBODIMENTS

With reference to the drawings, in particular to the embodiments shown in FIGS. 5 to 9, a source voltage regulating circuit embodying this invention is generally shown at 1 in schematic form. The circuit 1 is useful in an electronic memory device to locally regulate the modulation of the source voltage of the non-volatile memory cells 3 during the cell programming and/or reading phases. Memory device is here meant any monolithic electronic device incorporating an array of memory cells laid into rows and columns, as well as circuit portions that are associated with the cell array to serve functions of addressing, decoding, reading, writing, and erasing the contents of the memory cells. A device as above may be, for instance, a semiconductor-integrated memory chip of the non-volatile flash EEPROM type, which is split into sectors and can be electrically erased.

Each memory cell comprises a floating gate transistor having source S, drain D, and control gate G terminals.

Between the circuit portions that are associated with the cell array there intervene the regulating circuit 1 and program-load circuits that are individually supplied by a specified supply voltage. This voltage is generated internally of the integrated memory circuit and regulated by a drain voltage regulator.

The teachings of this invention are put to use specifically to effect a local regulation by the sector of the source voltage Vs, both during the programming and the reading phase. The voltage applied to the source terminal S of the cells 3 is a parameter that should be controlled with great accuracy during both the programming and the reading phase.

Figure 1:
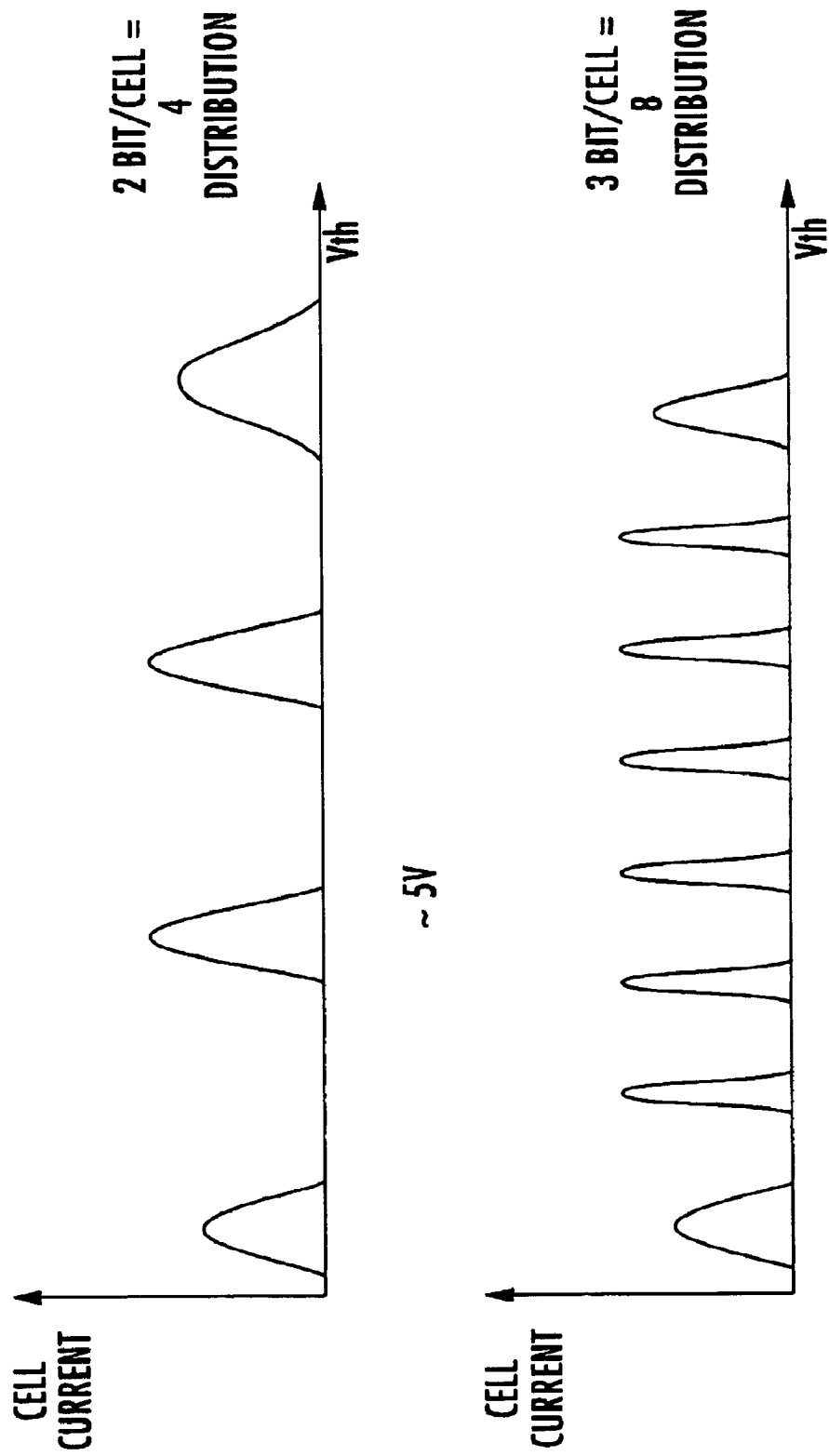
FIG. 1 schematically shows a comparative plot of the threshold voltage distribution in a conventional two-level memory cells with two bits per cell and in a multi-level memory with three bits per cell.
Figure 2:
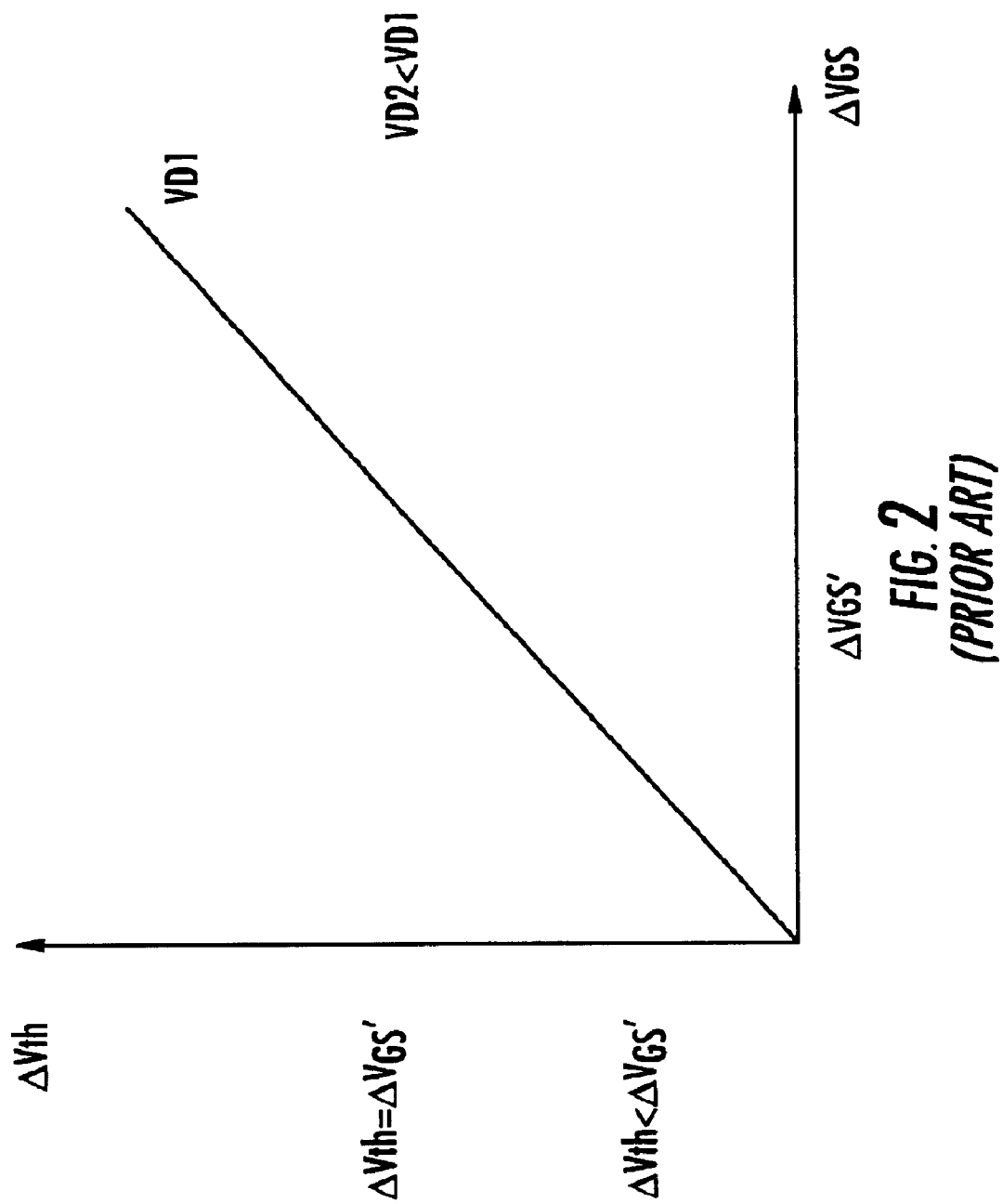
FIG. 2 shows, in a voltage vs. voltage plot, certain characteristic curves of a multi-level memory cell of the prior art.
Figure 3:
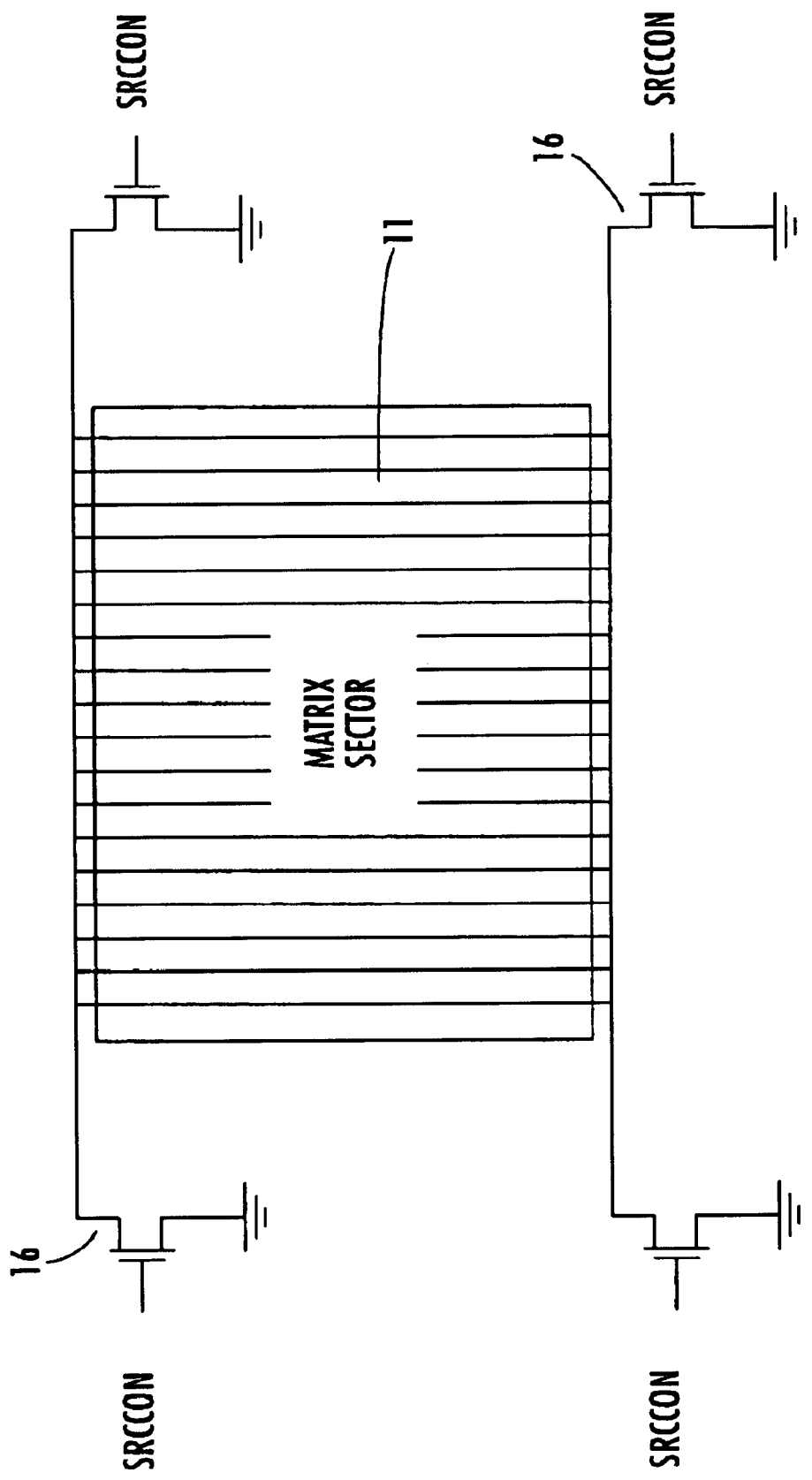
FIG. 3 schematically shows a sector of a memory cell array in an electronic non-volatile memory device, having pass transistors associated therewith to connect the source terminals of the cells to ground as in the prior art.
Figure 4:
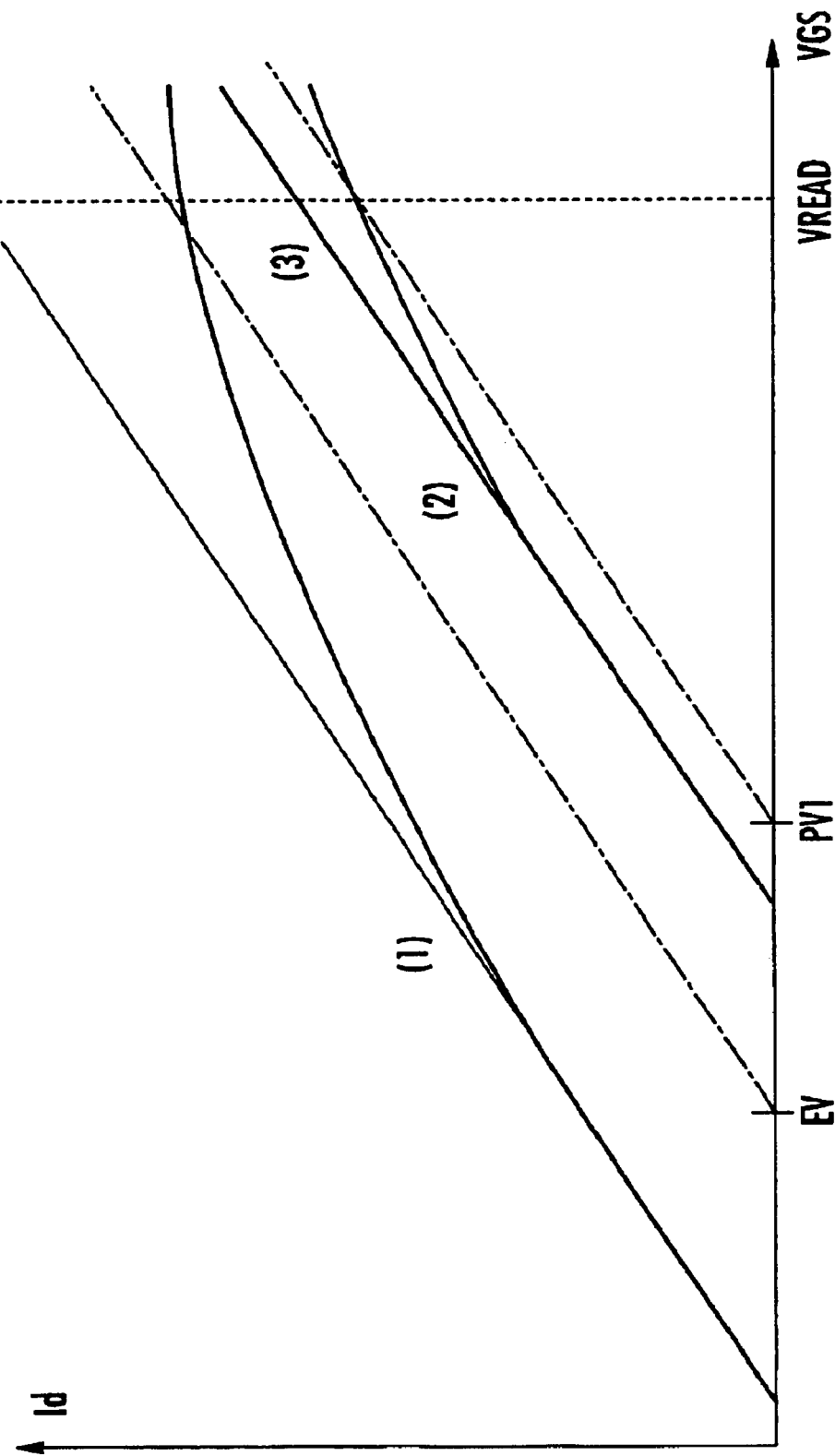
FIG. 4 shows a plot of a series of three voltage vs. current characteristic curves for memory cells that undergo different modulations of the source voltage as in the prior art.
Figure 5:
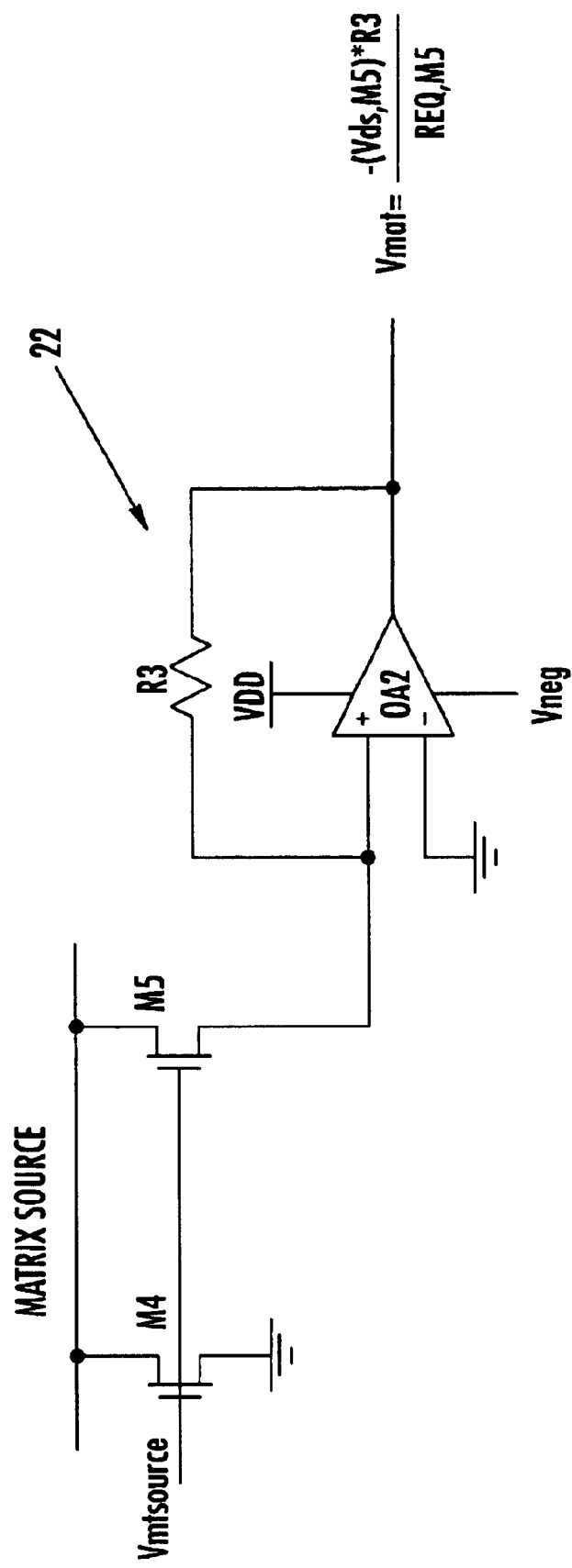
FIG. 5 schematically shows a circuit portion of the present invention operative to generate a voltage Vmat which is proportional to the source current of the memory cells.

According to the invention, the source voltage is regulated by comparing the current Is that flows through the source S of the array with a suitable reference current Iref, as schematically illustrated by the schematic example of FIG. 5.

When the current Is that flows through the source terminal S is smaller than the reference current Iref, a suitable controlled current generator 25 injects current into the source terminal S until the array current values equal the reference current ones. The value of the reference current Iref is equal to the largest current that can flow through the source S, viz. the current that produces the maximum modulation of the source voltage with respect to ground level. Note should be taken of that it matters less that the level of the source voltage during the programming phase be identical to the one of the level during the reading or verifying phase than that said level be held constant throughout the programming algorithm and as the programming pattern varies.

Let us see now in detail how the method indicated above can be implemented. The embodiments of FIGS. 5 and 6 respectively comprise a first circuit portion comprising a branch 22 where an array voltage Vmat is generated, and a second circuit portion having a branch 23 where a reference voltage Vref is generated. Also provided are: a comparator 24 arranged to compare the two voltages, and a driven current generator 25 for stabilizing the source voltage, both components being illustrated in FIG. 7.

Let us assume first that the value of the drain current Id during the programming phase is not much different from the current draw of the cells located in the most erased of the distributions during the reading phase. This assumption is made plausible by that a multi-level flash cell located in the erased distribution exhibits on reading an average drain current of 70 $\mu$A. On the other hand, upon receiving a programming pulse under applied voltages VDS=4V, VBS=1.2V and VGS=0.3V+Vth, this same cell would exhibit a drain current of about 60 $\mu$A.

With reference to FIG. 5, the place of any one of the transistors arranged as shown to connect the array source to ground is taken, according to the invention, by two transistors M4 and M5 such that:

$(W/L)_{M4}=(n-1)(W/L)_{M5}$, where n is the number of cells being programmed in parallel.

The selection signal Vmtsource to the gates of transistors M4 and M5, instead of being the same level as the device power supply, is generated by a suitable regulator, so that the contribution to source modulation from variations of VDD can be reduced or eliminated. By arranging for the signal Vmtsource to be a high-voltage signal (e.g. equal to the read gate voltage level), the full-load value to the source can be decreased and the "modulation" effects reduced accordingly.

An operational amplifier OA2 compares the outgoing voltage from transistor M5 with the ground value. This amplifier has its output fed back to an input through a resistor R3. By reason of the virtual ground provided by opamp OA2 being supplied between the positive supply VDD and the negative supply Vneg, this transistor M5 will be in the same bias condition as transistor M4, and the following current passed through it:

$$ID_{M4}/(n-1)=(Vds_{M5})/Req_{M5}$$

Since the amplifier OA2 is an inverting configuration, its output voltage Vmat is given as:

$$Vmat=R3*(-Vds_{M5})/Req_{M5},$$

i.e., proportional to a fraction of the current Is flowing through the source node.

Figure 6:
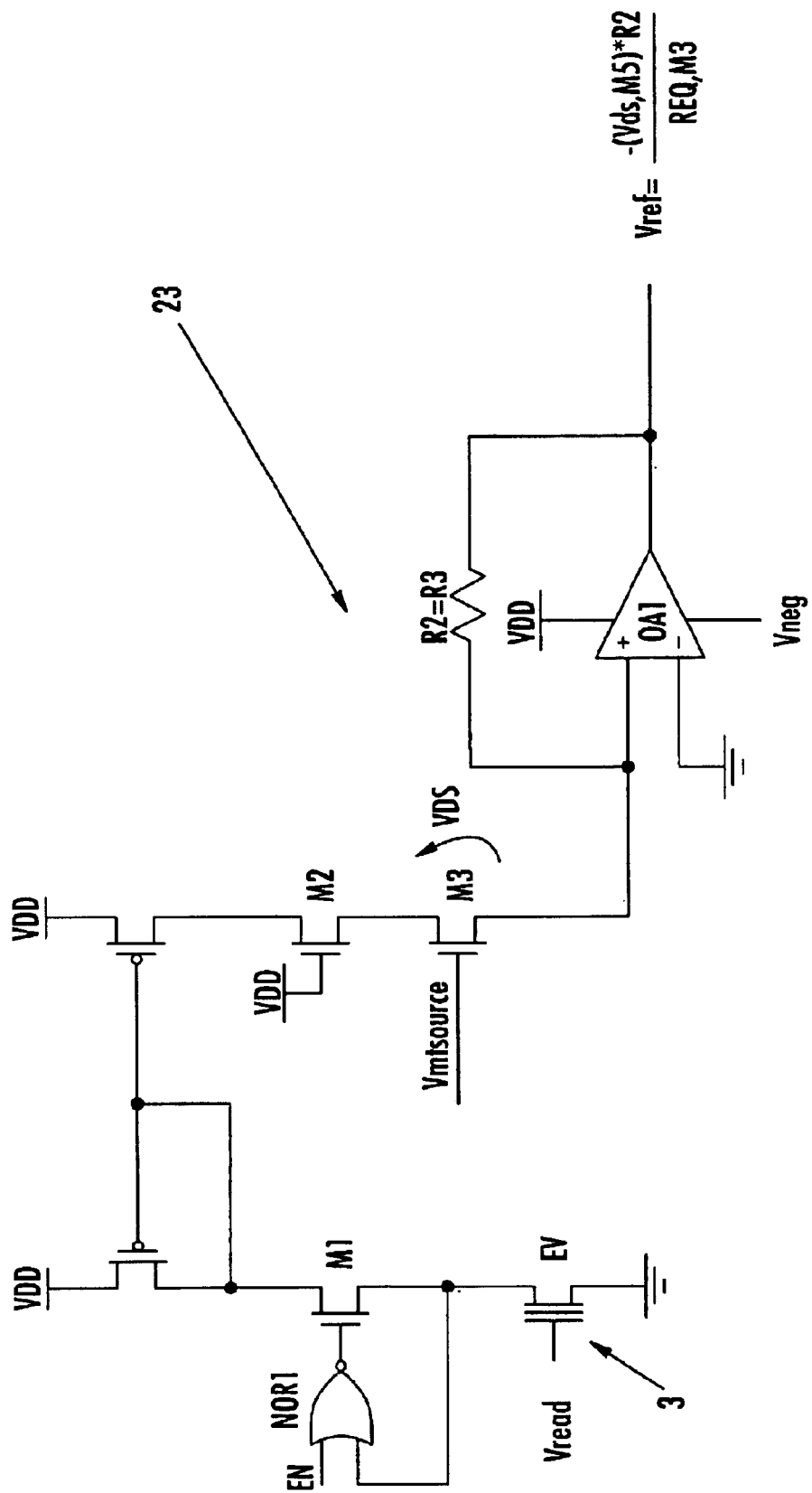
FIG. 6 schematically shows a circuit portion operative to generate a reference voltage Vref.

Shown in FIG. 6 is the circuit portion where the reference voltage Vref is generated. The current of a flash cell 3 in the most erased distribution, as biased for the reading condition, is mirrored on the branch 23 that includes transistors M2 and M3. Transistor M3 is the same size as the transistor M5 shown in FIG. 5 and receives the signal Vmtsource, with resistor R2 being the same value as R3, and opamp OA1 identical with OA2. Similar as in the array branch 22, the voltage Vref output from the opamp is given as:

$$Vref=R2*(-Vds_{M3})/Req_{M3},$$

i.e. is proportional to the current that is generated by an erased cell, which has a similar value to that of the drain current Id during the programming step. This means that the voltage Vref will be proportional to the current flowing through M5 when all the cells are connected to the program-load circuits 1.

The branch 23 further includes a circuit block comprising a logic gate NOR1 and a transistor M1 acting as a regulator for the drain voltage, to prevent the soft writing that would result from continual application of excessively high voltages to the drain. In addition, the voltage Vref is generated according to the flash memory cell 3, and allows variations in the cell gain and in the value of $Req_{M3}$ to be followed.

Figure 7:
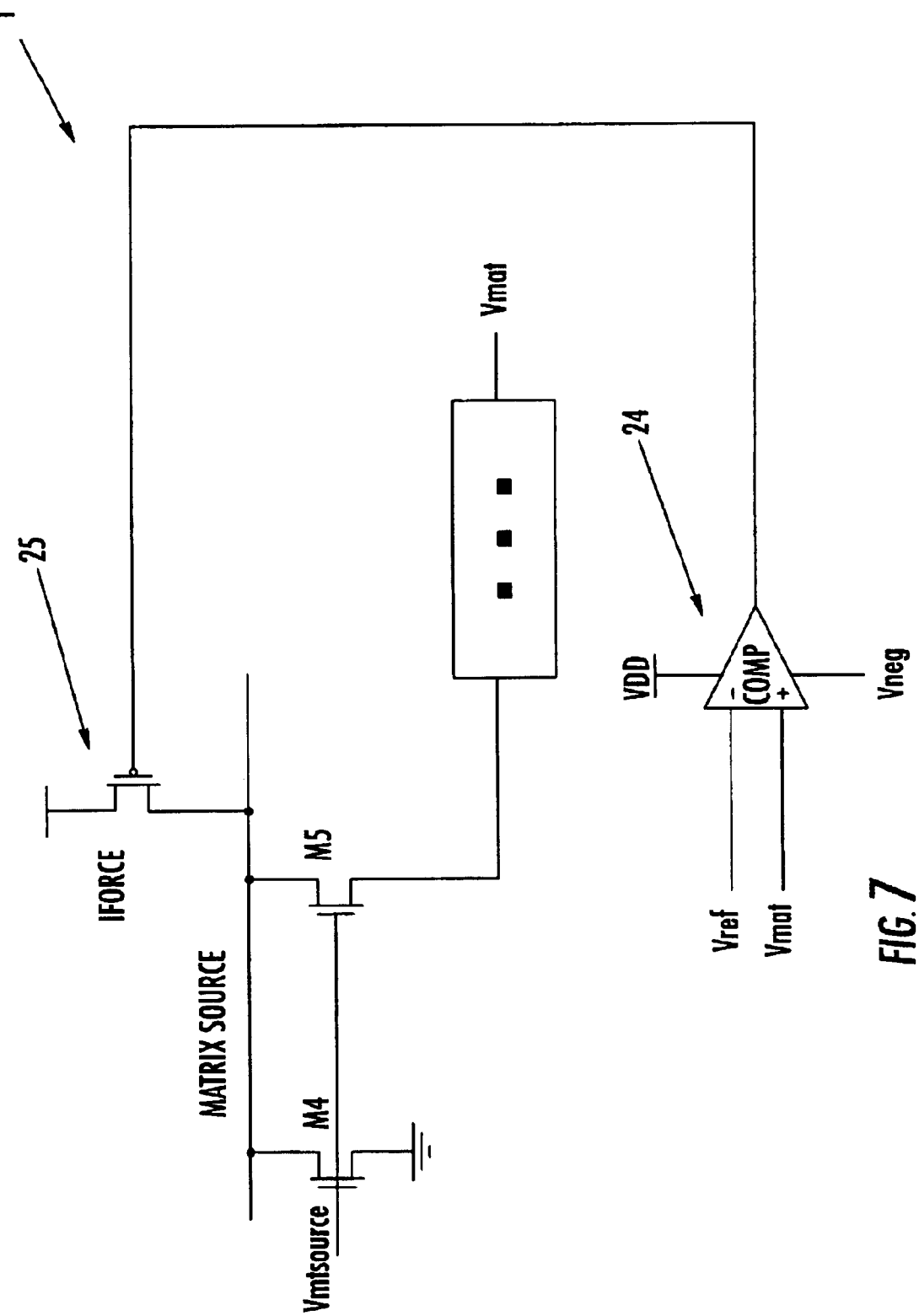
FIG. 7 shows an example of a comparison between the voltages generated by the circuit portions of FIGS. 5 and 6.

FIG. 7 shows a circuit 21 representing a combination of the circuit portions of FIGS. 5 and 6, and allows the comparison between the voltages Vmat and Vref, this taking place through the comparator 24 COMP being fed between the VDD and the negative voltage Vneg. When voltage Vmat is lower than voltage Vref, that is, if a smaller current Is flows through the source node than would flow if all the cells were connected to their respective program-load circuits, the output of the comparator 24 will force the controlled current IFORCE generator 25 to inject, into a node MATRIX SOURCE, a current given as:

$$IFORCE=I, \text{full load}-I, \text{measured}$$

thus keeping the voltage to the node MATRIX SOURCE at a constant value.

This compensation method can be effectively used to verify the programming and erasing phases, when the current injected into the source S is function of the programming pattern and the point reached by the programming algorithm. However, the method is also useful to the reading step, when the current injected into the source is dependent on a pattern previously programmed in the cells.

During the reading and verifying phases, the largest current Is that flows through the source S is equal to the largest current of the cells located in the most erased distribution multiplied by the number of cells that are read or verified in parallel. This is, therefore, what justifies using a cell 3 that has been programmed to the level EV for the purpose of generating the reference voltage. However, this is not always true, since while the program pulse is being applied, for example, the current would be dependent on the cell geometry and on the gate voltage step applied (as well as on the values of the drain, source, and body voltages).

Figure 8:
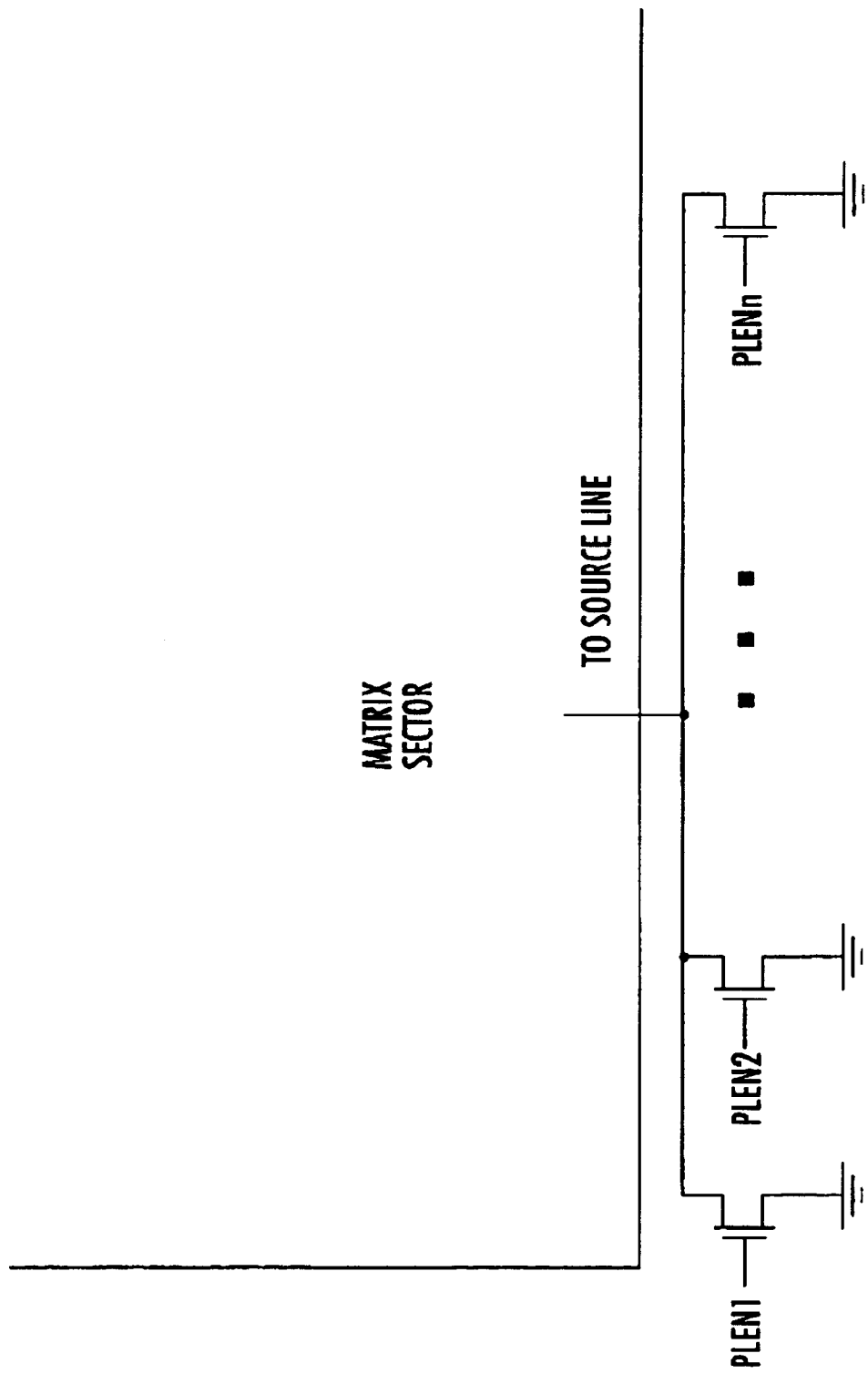
FIG. 8 schematically shows an improved part of the example in FIG. 5.

There are two ways of obviating this further difficultly. A first approach is shown in FIG. 8, whereby the transistor linking the source node to ground, viz. the connection provided by the parallel of transistors M4 and M5 in FIG. 5, is split into a set of n elementary transistors, where n is the number of cells that are programmed in parallel. The gates of these n transistors can be driven by signals PLENi, which signals are the selection signals of the program-load circuits as possibly brought to a regulated voltage level for them not to be affected by the modulation due to variations of VDD, e.g. brought to a high voltage level for lower resistivity of the individual pass transistors.

While programming pulses are being applied, a number of source pass transistors equal to the number of program-loads in operation, viz. the number of cells through which the program current is actually flowing, are connected in. In this way, the source line will be held at a constant value during the programming algorithm, while for the verifying and reading operations, the arrangements shown in FIGS. 5–7 can still be used.

Figure 9:
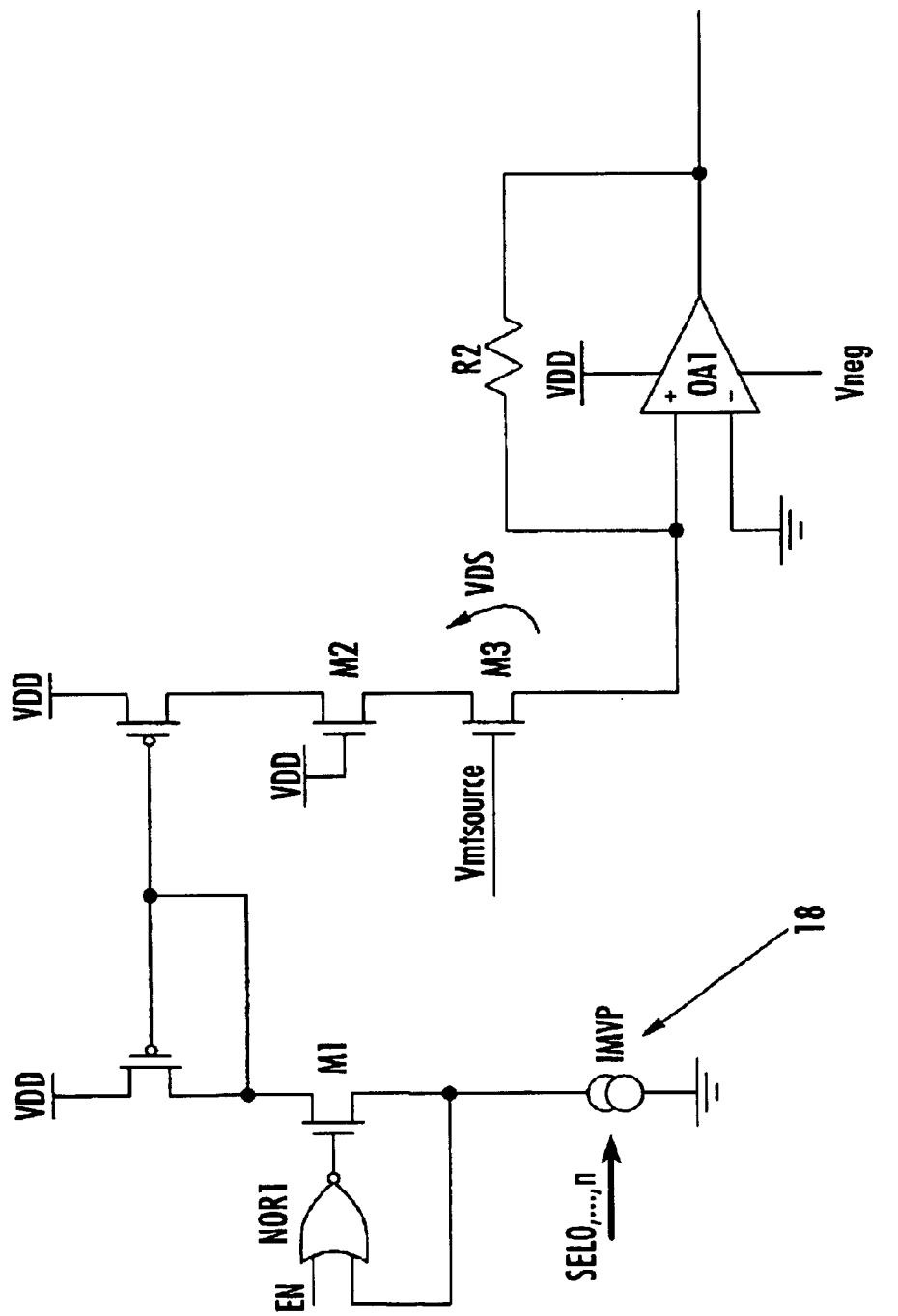
FIG. 9 schematically shows a modified embodiment of the example in FIG. 6.

There is, however, another way of reducing or minimizing source voltage modulation, which is just as effective. This approach would use the arrangements of FIGS. 5–7 even when the level of the programming current considerably differs from that of the cells in the erased distribution. FIG. 9 shows a comprehensive arrangement that provides for multiple reference voltages to be used on the occasion during those steps where source voltage modulation is a factor.

Instead of the array cell 3 located in the distribution having the highest current level, a current generator 18 is employed which is controlled by appropriate control signals $S_{0, \ldots, n}$, whereby the current IMVP from the generator can be changed. In this way, one circuit can be effectively used in any of the device operation modes, viz. the program, program verify, erase verify, and read modes, by merely varying the value of the current IMVP.

To summarize, the regulation method and circuit of this invention allow the voltages to the source terminals of the memory cells to be stabilized during the steps of programming and reading multi-level flash memories. By keeping the values of such voltages stable during the program operations, the invention described above enables the gate pulses applied during the programming algorithm to effectively produce a constant threshold voltage skip at each pulse and with any program patterns.

Furthermore, the method of stabilizing the source voltage according to the invention is also applicable to the verify operations, thereby to reduce the undefined portion from the sense amplifier due to the source voltage modulation brought about by the verifying and reading steps taking place under bias conditions unlike those of the cells. These are not conditions to be disregarded where flash memories that can store two or more bits per cell are involved.

That which is claimed is:

1. A method for regulating a source terminal voltage in a non-volatile memory cell during a cell programming phase, the method comprising:

comparing a source current of the cell array with a reference current;

converting a fraction of the source current to a converted voltage;

generating a comparison result by comparing the converted voltage with a voltage generated from a memory cell acting as a reference and being programmed to a distribution with the highest current levels; and using the comparison result for controlling a current generator to inject into the source terminal a current to regulate the source terminal voltage.

2. A method according to claim 1 wherein the source terminal voltage is regulated to a substantially constant value.

3. A method according to claim 1 wherein comparing comprises comparing the source current with a reference current provided by a generator of a current that is varied by n control signals.

4. A method for regulating a source terminal voltage in a non-volatile memory cell during a cell reading phase, the method comprising:

comparing a source current of the cell array with a reference current;

converting a fraction of the source current to a converted voltage;

generating a comparison result by comparing the converted voltage with a voltage generated from a memory cell acting as a reference and being programmed to a distribution with the highest current levels; and using the comparison result for controlling a current generator to inject into the source terminal a current to regulate the source terminal voltage.

5. A method according to claim 4 wherein the source terminal voltage is regulated to a substantially constant value.

6. A method according to claim 4 wherein comparing comprises comparing the source current with a reference current provided by a generator of a current that is varied by n control signals.

7. A circuit for regulating a source terminal voltage in a memory device comprising an array of non-volatile memory cells divided into sectors, with each cell including at least one floating gate, the circuit comprising:

a comparator having first and second comparator inputs, and a comparator output;

a first circuit branch connected to the first comparator input and operative to generate an array voltage being proportional to at least a fraction of a current flowing through the source terminal;

a second circuit branch connected to the second comparator input and operative to generate a reference voltage being proportional to a current generated by an erased cell; and a current generator controlled by the comparator output to regulate the source voltage by injecting a current into the source terminal.

8. A circuit according to claim 7 wherein said current generator is controlled by control signals to vary a current generated by said current generator.

9. A circuit according to claim 7 wherein said current generator injects the source terminal during a reading step with a current dependent on a pattern previously programmed into the cells.

10. A memory device comprising:

an array of non-volatile memory cells divided into sectors, with each cell including at least one floating gate transistor; and a circuit for regulating a voltage at a source terminal connected to said array and comprising a comparator having first and second comparator inputs, and a comparator output, a first circuit branch connected to the first comparator input and operative to generate an array voltage being proportional to at least a fraction of a current flowing through the source terminal, a second circuit branch connected to the second comparator input and operative to generate a reference voltage being proportional to a current generated by an erased cell, and a current generator controlled by the comparator output to regulate the source voltage by injecting a current into the source terminal.

11. A memory device according to claim 10 wherein said current generator is controlled by control signals to vary a current generated by said current generator.

12. A memory device according to claim 10 wherein said current generator injects the source terminal during a reading step with a current dependent on a pattern previously programmed into the cells.

13. A multi-level memory device of a flash EEPROM type comprising:

an array of non-volatile memory cells divided into sectors, with each cell including at least one floating gate transistor; and a set of n source pass transistors connected between nodes of each sector and corresponding voltage references, with n being based upon a number of array cells to be programmed.

14. A multi-level memory device according to claim 13 wherein n matches a number of active drain program-loads.

15. A multi-level memory device according to claim 14 wherein said n source pass transistors are driven by signals corresponding to selection signals of the program-load circuits.

* * * * *